US012369358B2

United States Patent
Trivedi et al.

(10) Patent No.: US 12,369,358 B2
(45) Date of Patent: Jul. 22, 2025

(54) CO-INTEGRATED HIGH PERFORMANCE NANORIBBON TRANSISTORS WITH HIGH VOLTAGE THICK GATE FINFET DEVICES

(71) Applicant: Intel Corporation, Santa Clara, CA (US)

(72) Inventors: Tanuj Trivedi, Hillsboro, OR (US); Rahul Ramaswamy, Portland, OR (US); Jeong Dong Kim, Scappoose, OR (US); Ting Chang, Portland, OR (US); Walid M. Hafez, Portland, OR (US); Babak Fallahazad, Porland, OR (US); Hsu-Yu Chang, Hillsboro, OR (US); Nidhi Nidhi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 956 days.

(21) Appl. No.: 16/713,619

(22) Filed: Dec. 13, 2019

(65) Prior Publication Data
US 2021/0184051 A1 Jun. 17, 2021

(51) Int. Cl.
*H10D 30/67* (2025.01)
*H10D 84/01* (2025.01)
(Continued)

(52) U.S. Cl.
CPC ..... *H10D 30/6757* (2025.01); *H10D 30/6735* (2025.01); *H10D 84/0128* (2025.01);
(Continued)

(58) Field of Classification Search
CPC ........... H01L 29/0673; H01L 29/66439; H01L 29/775; H01L 29/785; H01L 27/0886; H01L 21/823431
See application file for complete search history.

(56) References Cited

U.S. PATENT DOCUMENTS 10,727,138 B2 7/2020 Le
11,289,485 B2 3/2022 Funkuzaki
(Continued)

FOREIGN PATENT DOCUMENTS

TW 201810673 3/2018
WO WO 2018182570 10/2018
WO WO 2019116827 6/2019

OTHER PUBLICATIONS

Office Action for Taiwan Patent Application No. 109132741 mailed Apr. 19, 2024, 23 pgs.
(Continued)

*Primary Examiner* — Tuan A Hoang
(74) *Attorney, Agent, or Firm* — Schwabe, Williamson & Wyatt, P.C.

(57) ABSTRACT

Embodiments disclosed herein include semiconductor devices and methods of forming such devices. In an embodiment, a semiconductor device comprises a substrate, a first transistor over the substrate, where the first transistor comprises a vertical stack of first semiconductor channels, and a first gate dielectric surrounding each of the first semiconductor channels. The first gate dielectric has a first thickness. In an embodiment, the semiconductor device further comprises a second transistor over the substrate, where the second transistor comprises a second semiconductor channel. The second semiconductor channel comprises pair of sidewalls and a top surface. In an embodiment, a second gate dielectric is over the pair of sidewalls and the top surface of the fin, where the second gate dielectric has a second thickness that is greater than the first thickness.

18 Claims, 17 Drawing Sheets

(51) Int. Cl.
*H10D 84/03* (2025.01)
*H10D 84/83* (2025.01)

(52) U.S. Cl.
CPC ....... *H10D 84/0158* (2025.01); *H10D 84/038* (2025.01); *H10D 84/834* (2025.01)

(56) References Cited

U.S. PATENT DOCUMENTS

| | | | |
|---|---|---|---|
| 2012/0007051 A1* | 1/2012 | Bangsaruntip | H01L 29/0669 977/762 |
| 2015/0255542 A1* | 9/2015 | Cai | H01L 29/7843 438/283 |
| 2016/0260740 A1* | 9/2016 | Degors | H01L 29/66742 |
| 2017/0033013 A1* | 2/2017 | Kim | H10D 84/038 |
| 2017/0278842 A1 | 9/2017 | Song | |
| 2018/0033871 A1* | 2/2018 | Xie | H01L 21/02532 |
| 2018/0090569 A1* | 3/2018 | Yang | H01L 27/0207 |
| 2018/0114727 A1 | 4/2018 | Rodder | |
| 2019/0198629 A1* | 6/2019 | Yeung | H10D 30/014 |
| 2019/0198667 A1 | 6/2019 | Liu | |
| 2019/0221641 A1 | 7/2019 | Glass | |
| 2019/0355724 A1* | 11/2019 | Chiang | H01L 29/78696 |
| 2019/0378906 A1* | 12/2019 | Loubet | H01L 29/66742 |
| 2021/0074841 A1* | 3/2021 | Lin | H10D 30/43 |

OTHER PUBLICATIONS

Notice of Allowance for Taiwan Patent Application No. 109132741 mailed Nov. 20, 2024, 3 pgs.
Office Action for Japan Patent Application No. 2020-147917 mailed Jul. 23, 2024, 3 pgs.

\* cited by examiner

US 12,369,358 B2

CO-INTEGRATED HIGH PERFORMANCE NANORIBBON TRANSISTORS WITH HIGH VOLTAGE THICK GATE FINFET DEVICES

TECHNICAL FIELD

Embodiments of the present disclosure relate to semiconductor devices, and more particularly to semiconductor devices with nanoribbon transistors co-integrated with high voltage thick gate tri-gate transistors.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

Different functional blocks within a die may need optimization for different electrical parameters. In some instances high voltage transistors for power applications need to be implemented in conjunction with high speed transistors for logic applications. High voltage transistors typically suffer from high leakage current. In nanowire devices, a thicker oxide results in the space between nanowires being reduced to the point that little or no gate metal can be disposed between the nanowires.

EMBODIMENTS OF THE PRESENT DISCLOSURE

Figure 1A:
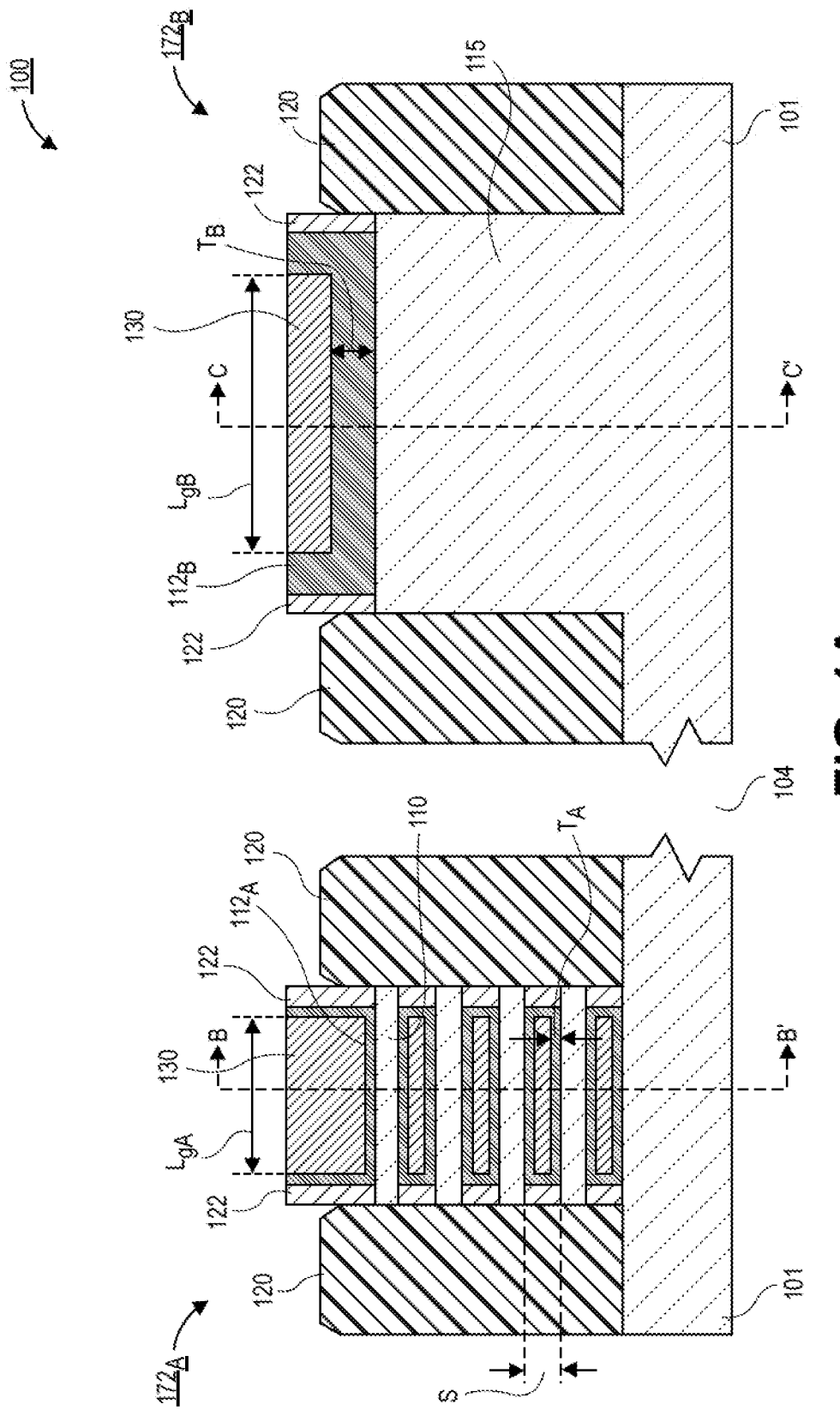
FIG. 1A is a cross-sectional illustration of a first transistor and a second transistor over a substrate, where the first transistor is a gate all around (GAA) transistor and the second transistor is a tri-gate transistor, in accordance with an embodiment.

Described herein are nanoribbon transistors co-integrated with high voltage thick gate tri-gate transistors, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension. As used herein, "high-voltage" may refer to voltages of approximately 1.0V or higher.

As noted above, integration of thick gate dielectric nanoribbon transistors with standard thickness gate dielectric nanoribbon transistors is problematic. Particularly, the thicker gate dielectrics may merge together between the nanoribbons. That is, the gate dielectrics block off the gap between nanoribbons and prevent filling gate metal into the gaps. As such, gate all around (GAA) control of the thick gate dielectric nanoribbon transistors is not always possible.

Accordingly, embodiments disclosed herein include the integration of GAA devices with non-planar transistors, such as tri-gate devices. Tri-gate devices (sometimes also referred to as "finFET" devices) allow for thick gate dielectrics. This is because there is no gap between portions of the channel, as is the case with nanoribbon devices. Whereas, GAA devices require gate metal (and gate dielectric) to wrap entirely around the channel, in a tri-gate device, the gate metal (and gate dielectric) typically cover three surfaces (e.g., a pair of sidewalls and a top surface) of the channel.

Furthermore, thick gate devices are typically used for analog or other high-voltage applications. Such applications do not typically require the additional scaling (e.g., better short channel effects) provided by GAA devices. Additionally, the switching frequencies for thick gate devices are typically lower than those required for logic applications. Therefore, embodiments disclosed herein leverage the additional performance improvements of GAA devices while maintaining ease of fabrication for thick gate devices using tri-gate devices.

In an embodiment, the co-integration of GAA devices with tri-gate devices is implemented by forming the different devices on different regions of the substrate. The GAA devices may be formed from fins in a region of the substrate that comprises an alternating stack of channel layers and sacrificial layers, and the tri-gate devices may be formed from fins in a region of the substrate that comprises a single channel layer. Embodiments disclosed herein provide different process flows for providing a substrate that includes both the first region and the second region used to form the various transistor types.

Referring now to FIG. 1A, a cross-sectional illustration of a semiconductor device 100 is shown, in accordance with an embodiment. The semiconductor device 100 comprises a first transistor $172_A$ and a second transistor $172_B$ that are both formed over a substrate 101. In the illustrated embodiment, the first transistor $172_A$ is separated from the second transistor $172_B$ by a break 104 in the substrate 101. The break 104 indicates that the first transistor $172_A$ and the second transistor $172_B$ may be positioned at different regions of the substrate 101, and may not be adjacent to each other and/or oriented in the same direction.

In an embodiment, the substrate 101, may include a semiconductor substrate and an isolation layer (not shown) over the semiconductor substrate 101. In an embodiment, the underlying semiconductor substrate 101 represents a general workpiece object used to manufacture integrated circuits. The semiconductor substrate 101 often includes a wafer or other piece of silicon or another semiconductor material. Suitable semiconductor substrates 101 include, but are not limited to, single crystal silicon, polycrystalline silicon and silicon on insulator (SOI), as well as similar substrates formed of other semiconductor materials, such as substrates including germanium, carbon, or group III-V materials.

The illustration of FIG. 1A is along the length of the channels of the two transistors $172_A$ and $172_B$. In a particular embodiment, the first transistor $172_A$ is a high speed transistor (e.g., suitable for logic operations), and the second transistor $172_B$ is a high-voltage transistor (e.g., suitable for analog and/or power operations). The first transistor $172_A$ is a GAA transistor (e.g., a nanoribbon transistor). The second transistor $172_B$ is a tri-gate transistor.

In an embodiment, the first transistor $172_A$ may comprise a plurality of nanoribbon channels 110 arranged in a vertical stack. The nanoribbon channels 110 may comprise any suitable semiconductor materials. For example, the nanoribbon channels 110 may comprise silicon or group III-V materials. The nanoribbon channels 110 may have a spacing S between them. The spacing S may be optimized for high-speed switching applications. For example, the spacing S may be approximately 10 nm or less. A first gate dielectric $112_A$ may wrap entirely around the outer surface of each nanoribbon channel 110. The first gate dielectric $112_A$ may have a first thickness $T_A$. The first thickness $T_A$ may be sized so that there is no pinching of the first gate dielectric $112_A$ between nanoribbon channels 110. For example, the first thickness $T_A$ may be approximately 3 nm or less. Accordingly, a gap is present between adjacent surfaces of the first gate dielectric $112_A$. In an embodiment, the first gate dielectric $112_A$ is disposed with a conformal deposition process (e.g., atomic layer deposition (ALD)). The conformal deposition process may also deposit the first gate dielectric $112_A$ over interior surfaces of spacers 122 and over the surface of the substrate 101. However, in other embodiments, the first gate dielectric $112_A$ is grown (e.g., with an oxidation process). In such embodiments, the first gate dielectric $112_A$ may not be present over the interior surfaces of the spacers 122. That is, a gate electrode 130 may directly contact the spacers 122.

In an embodiment, the gate electrode 130 may fill the gap between nanoribbon channels 110 in order to wrap entirely around the outer surface of each nanoribbon channel 110. This provides GAA control for the first transistor $172_A$. In an embodiment, the first transistor $172_A$ may also comprise a pair of source/drain regions 120. The source/drain regions 120 may be separated from the gate electrode 130 by a pair of spacers 122. The nanoribbon channels 110 may pass through the spacers 122 to contact the source/drain regions 120.

In an embodiment, the second transistor $172_B$ may comprise a single semiconductor channel 115. In an embodiment, the semiconductor channel 115 may be fin shaped. As used herein, the semiconductor channel 115 may be referred to as a fin channel 115. The fin channel 115 may comprise any suitable semiconductor materials. For example, the fin channel 115 may comprise silicon or group III-V materials. The fin channel 115 may extend up from the substrate 101. In an embodiment, a second gate dielectric $112_B$ is disposed over surfaces of the fin channel 115 and a gate electrode 130 is disposed over the second gate dielectric $112_B$. In an embodiment, the second gate dielectric $112_B$ may be deposited with a conformal deposition process (e.g., ALD). The conformal deposition process may also deposit the second gate dielectric $112_B$ over interior surfaces of spacers 122. However, in other embodiments, the second gate dielectric $112_B$ is grown (e.g., with an oxidation process). In such embodiments, the second gate dielectric $112_B$ may not be present over the interior surfaces of the spacers 122. That is, a gate electrode 130 may directly contact the spacers 122. In some embodiments, the second gate dielectric $112_B$ comprises the same material as the first gate dielectric $112_A$. In other embodiments, the second gate dielectric $112_B$ comprises a different material than the first gate dielectric $112_A$.

In an embodiment, the second transistor $172_B$ comprises a pair of source/drain regions 120 formed on opposite ends of the fin channel 115. In an embodiment, the second transistor $172_B$ may also comprise a pair of spacers 122. The second gate dielectric $112_B$ and the gate electrode 130 may be disposed between the interior surfaces of the spacers 122. The fin channel 115 may pass through the spacers 122 to contact the source/drain regions 120.

In the view illustrated in FIG. 1A, the second gate dielectric $112_B$ and the gate electrode 130 are over the top surface of the fin channel 115, though it is to be appreciated that the second gate dielectric $112_B$ and the gate electrode 130 will also extend along sidewalls (into and out of the plane of FIG. 1A) to provide tri-gate control of the second transistor $172_B$.

In an embodiment, the second gate dielectric $112_B$ has a second thickness $T_B$. The second thickness $T_B$ is greater than the first thickness $T_A$. For example, the second thickness $T_B$ may be approximately 3 nm or greater. It is noted that the fin channel 115 does not include gaps between portions of the channel (as is the case with the nanoribbon channels 110). As such, the second gate dielectric $112_B$ may be deposited (or grown) to larger thicknesses without worrying about pinching that prevents filling of the gate electrode 130 around the surfaces of the fin channel 115. In an embodiment, the increased second thickness $T_B$ relative to the first thickness $T_A$ allows for the second transistor $172_B$ to support a higher voltage. For example, the second transistor $172_B$ may have an operating voltage of approximately 1.0V or higher.

In an embodiment, the first transistor $172_A$ and the second transistor $172_B$ may have different channel lengths. For example, the first transistor $172_A$ may have a first channel length $L_{gA}$ and the second transistor $172_B$ may have a second channel length $L_{gB}$ that is larger than the first channel length $L_{gA}$. The larger second channel length $L_{gB}$ allows for support of higher voltages, whereas the shorter first channel length $L_{gA}$ supports faster switching frequencies. In an embodiment, the second channel length $L_{gB}$ may be approximately 50 nm or greater, or approximately 100 nm or greater.

In an embodiment, the materials chosen for the first gate dielectric $112_A$ and the second gate dielectric $112_B$ may be any suitable high dielectric constant materials. For example, the first gate dielectric $112_A$ and the second gate dielectric $112_B$ may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the materials chosen for the gate electrodes 130 may be any suitable work function metal in order to provide the desired threshold voltage for operation as a P-type transistor or an N-type transistor. For example, when the metal gate electrode 130 will serve as an N-type workfunction metal, the gate electrode 130 preferably has a workfunction that is between about 3.9 eV and about 4.2 eV. N-type materials that may be used to form the metal gate electrode 130 include, but are not limited to, hafnium, zirconium, titanium, tantalum, aluminum, and metal carbides that include these elements, e.g., titanium carbide, zirconium carbide, tantalum carbide, hafnium carbide and aluminum carbide. Alternatively, when the metal gate electrode 130 will serve as a P-type workfunction metal, the gate electrode 130 preferably has a workfunction that is between about 4.9 eV and about 5.2 eV. P-type materials that may be used to form the metal gate electrode 130 include, but are not limited to, ruthenium, palladium, platinum, cobalt, nickel, and conductive metal oxides, e.g., ruthenium oxide. The gate electrode 130 may also comprise a workfunction metal and a fill metal (e.g., tungsten) over the workfunction metal.

In an embodiment, the source/drain regions 120 may comprise an epitaxially grown semiconductor material. The source/drain regions 120 may comprise a silicon alloy. In some implementations, the source/drain regions 120 comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions 120 may comprise alternative semiconductor materials (e.g., semiconductors comprising group III-V elements and alloys thereof) or conductive materials.

Figure 1B:
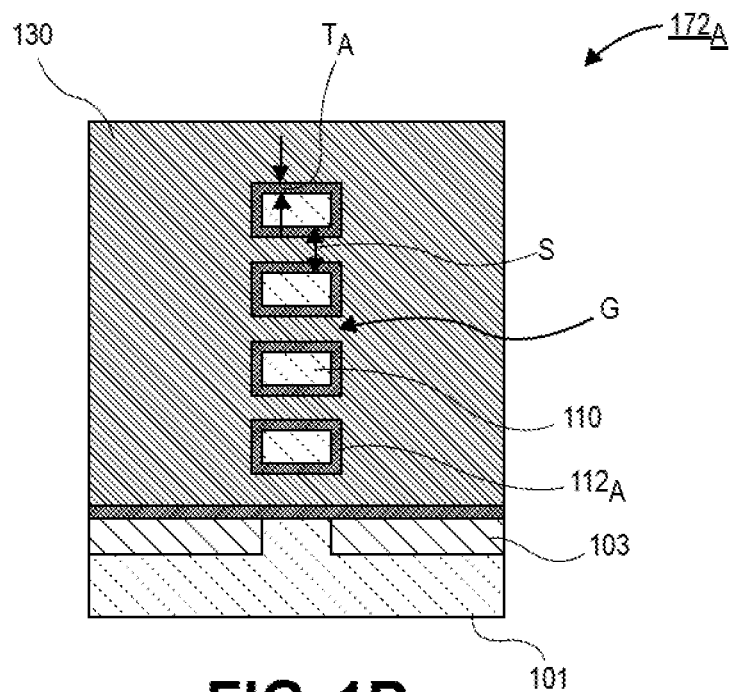
FIG. 1B is a cross-sectional illustration of the first transistor in FIG. 1A, in accordance with an embodiment.
Figure 1C:
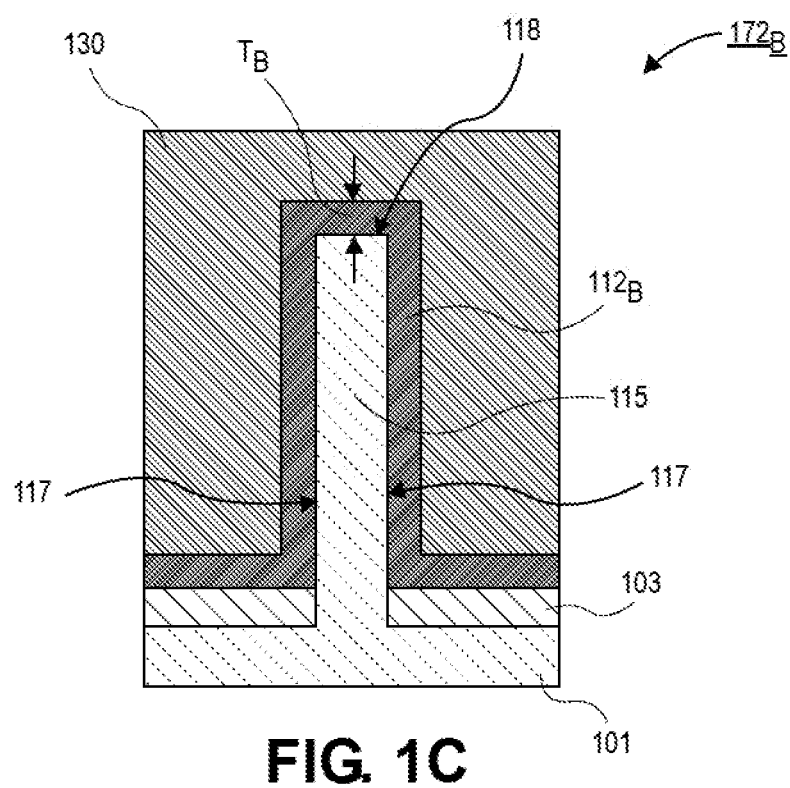
FIG. 1C is a cross-sectional illustration of the second transistor in FIG. 1A, in accordance with an embodiment.

Referring now to FIGS. 1B and 1C, cross-sectional illustrations of the first transistor $172_A$ and the second transistor $172_B$ along lines B-B' and C-C' in FIG. 1A are shown, respectively, in accordance with an embodiment.

Referring now to FIG. 1B, a cross-sectional illustrations across the channel region of the first transistor $172_A$ is shown, in accordance with an embodiment. As shown, the first gate dielectric $112_A$ wraps entirely around a perimeter of each of the nanoribbon channels 110. Additionally, the gate electrode 130 is able to fill the gap G between neighboring surfaces of the first gate dielectric $112_A$. The gate electrode 130 may be separated from the substrate 101 by an isolation layer 103. In some embodiments, the top surface of the isolation layer 103 may also be covered by the first gate dielectric $112_A$ (e.g. when an ALD process is used to deposit the first gate dielectric $112_A$).

Referring now to FIG. 1C, a cross-sectional illustration across the channel region of the second transistor $172_B$ is shown, in accordance with an embodiment. As shown, the fin channel 115 comprises sidewalls 117 and a top surface 118. The second gate dielectric $112_B$ is disposed over the sidewalls 117 above the isolation layer 103 and the top surface 118. The gate electrode 130 covers the second gate dielectric $112_B$. Accordingly, three surfaces of the fin channel 115 are controlled to provide a tri-gate second transistor $172_B$. In some embodiments, the top surface of the isolation layer 103 may also be covered by the second gate dielectric $112_B$ (e.g. when an ALD process is used to deposit the second gate dielectric $112_B$).

Referring now to FIGS. 2A-2F, a series of cross-sectional illustrations depicting a process for forming an electronic device 200 with a first region and a second region is shown, in accordance with an embodiment. The first region may comprise a stack with alternating channel layers and sacrificial layers in order to form a nanoribbon device. The second region may comprise a single channel layer in order to form a tri-gate device.

Figure 2A:
FIGS. 2A-2F are cross-sectional illustrations depicting a process for forming a first region comprising an alternating stack of channel layers and sacrificial layers and a second region comprising a single channel layer, in accordance with an embodiment.

Referring now to FIG. 2A, a cross-sectional illustration of an electronic device 200 is shown, in accordance with an embodiment. The electronic device 200 comprises a substrate 201. The substrate 201 may be a semiconductor substrate, such as those described above with respect to FIG. 1A.

Figure 2B:
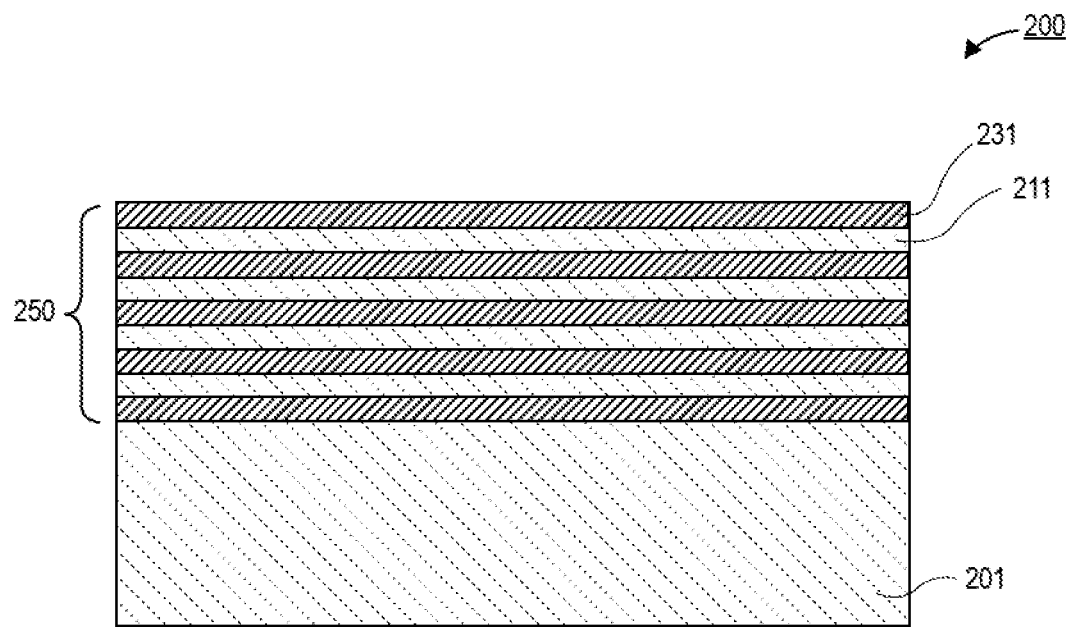

Referring now to FIG. 2B, a cross-sectional illustration of the electronic device 200 after a stack 250 of alternating channel layers 211 and sacrificial layers 231 is formed is shown, in accordance with an embodiment. In an embodiment, the channel layers 211 are the material chosen for use as the nanoribbons. The channel layers 211 and sacrificial layers 231 may each be a material such as, but not limited to, silicon, germanium, SiGe, GaAs, InSb, GaP, GaSb, InAlAs, InGaAs, GaSbP, GaAsSb, and InP. In a specific embodiment, the channel layers 211 are silicon and the sacrificial layers 231 are SiGe. In another specific embodiment, the channel layers 211 are germanium, and the sacrificial layers 231 are SiGe. The channel layers 211 and the sacrificial layers 231 may be grown with an epitaxial growth processes.

In the illustrated embodiment there are four channel layers 211. However, it is to be appreciated that there may be any number of channel layers 211 in the stack 250. In an embodiment, the topmost layer of the stack 250 is a sacrificial layer 231. In other embodiments, the topmost layer of the stack 250 may be a channel layer 211.

Figure 2C:
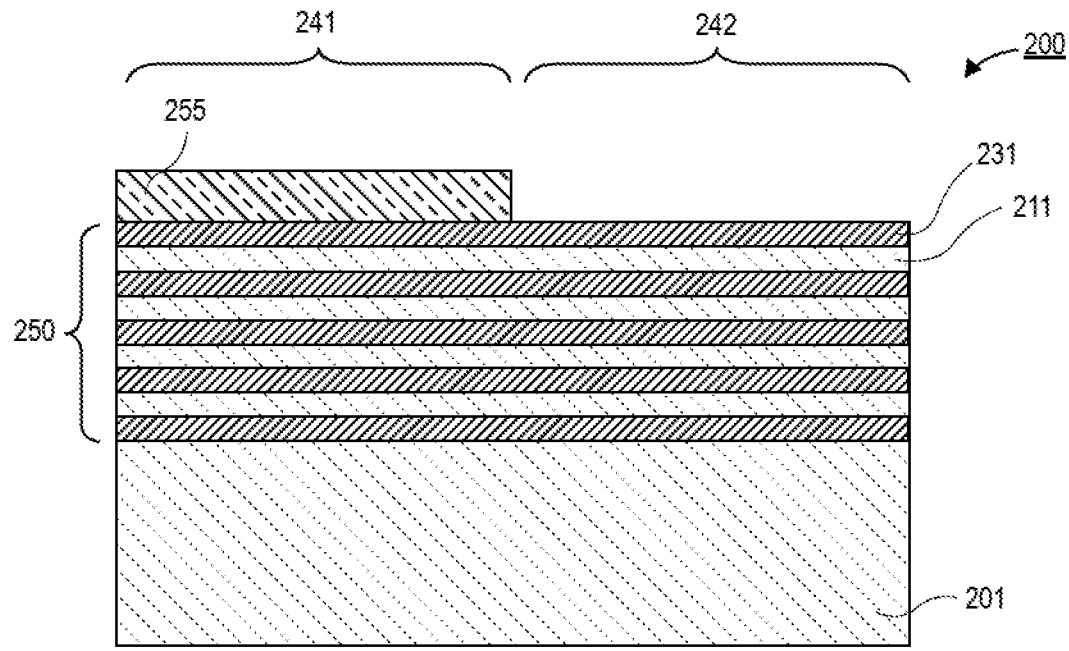

Referring now to FIG. 2C, a cross-sectional illustration of the electronic device 200 after a mask layer 255 is disposed over the stack 250 and patterned is shown, in accordance with an embodiment. In an embodiment, the mask layer 255 may be a resist or a hardmask. The mask layer 255 defines a first region 241 (below the mask 255) and a second region 242 (outside of the mask 255). The first region 241 is the region where nanoribbon transistor devices will be formed, and the second region 242 is the region where tri-gate transistor devices will be formed.

Figure 2D:
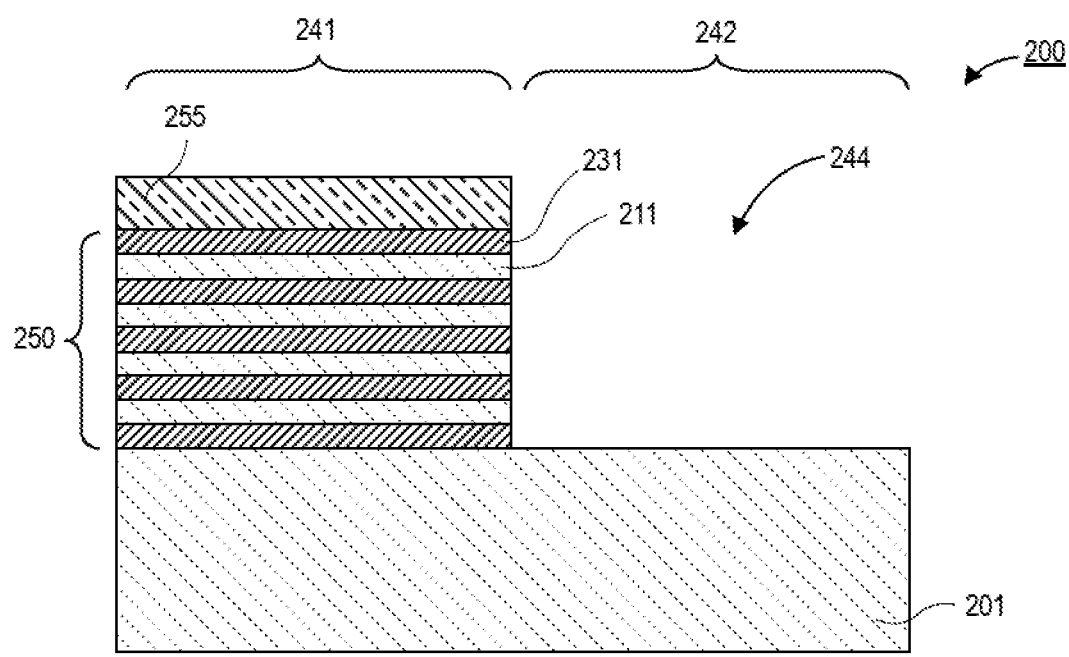

Referring now to FIG. 2D, a cross-sectional illustration of the electronic device 200 after the stack 250 is patterned is shown, in accordance with an embodiment. In an embodiment, the stack 250 may be patterned with an etching process (e.g., a dry etching process). The etching process may include one more different chemistries in order to etch through both the exposed channel layers 211 and the sacrificial layers 231. The etching process provides an opening 244 in the second region 242. The opening 244 exposes the substrate 201 in some embodiments.

Figure 2E:
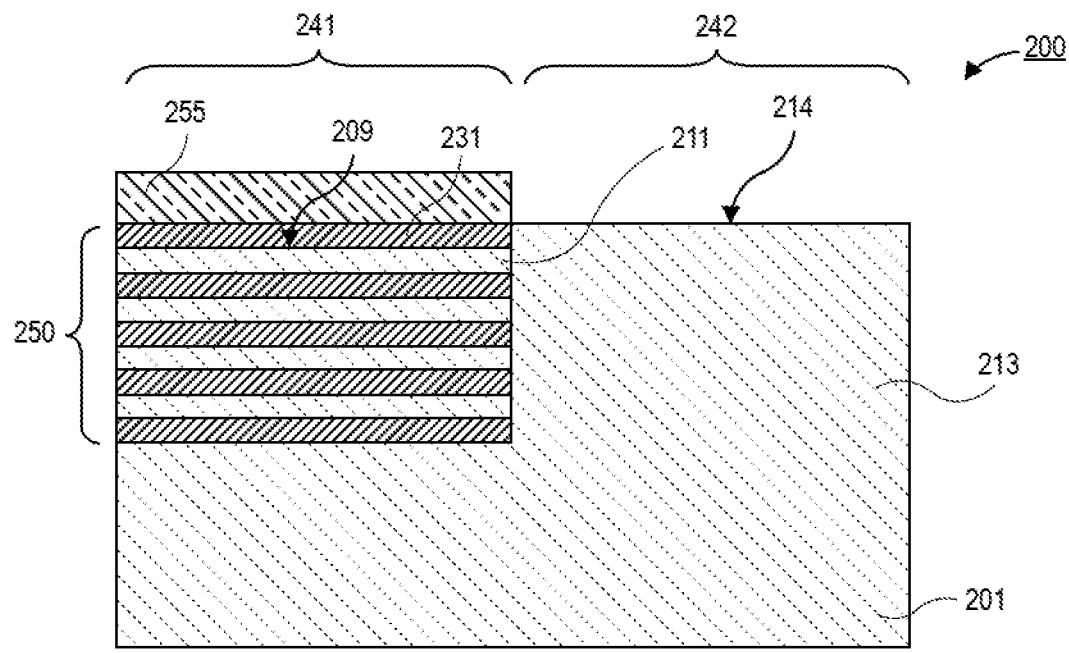

Referring now to FIG. 2E, a cross-sectional illustration of the electronic device 200 after a single channel layer 213 is disposed over the substrate 201 in the second region 242 is shown, in accordance with an embodiment. In an embodiment, the channel layer 213 may be the same material as the substrate 201, or the channel layer 213 may be a different material than the substrate 201. The channel layer 213 may be grown with an epitaxial growth process.

In an embodiment, the channel layer 213 is grown to a thickness that is at least equal to a top surface of the stack 250. As shown, a top surface 214 of the channel layer 213 may be above a top surface 209 of an uppermost channel layer 211 in the stack 250. In embodiments where a topmost layer of the stack 250 is a channel layer, the top surface 209 of the uppermost channel layer 211 may be substantially coplanar with the top surface of the channel layer 213.

Figure 2F:
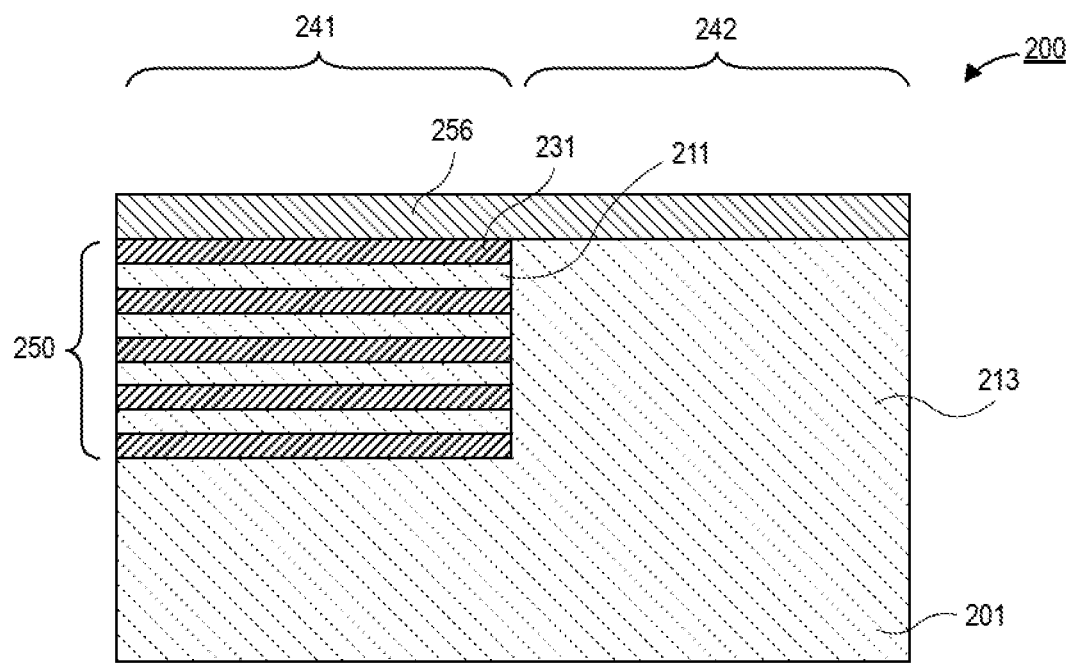

Referring now to FIG. 2F, a cross-sectional illustration of the electronic device 200 after a capping layer 256 is disposed over the stack 250 and the channel layer 213 is shown, in accordance with an embodiment. The capping layer 256 may be disposed after removal of the mask layer 255. In an embodiment, the capping layer 256 is an oxide or the like. The capping layer 256 may be used to protect the underlying layers during a fin patterning process.

Referring now to FIGS. 3A-3D, a series of cross-sectional illustrations depicting a process for forming an electronic device 300 with a first region and a second region is shown, in accordance with an embodiment. The first region may comprise a stack with alternating channel layers and sacrificial layers in order to form a nanoribbon device. The second region may comprise a single channel layer in order to form a tri-gate device.

Figure 3A:
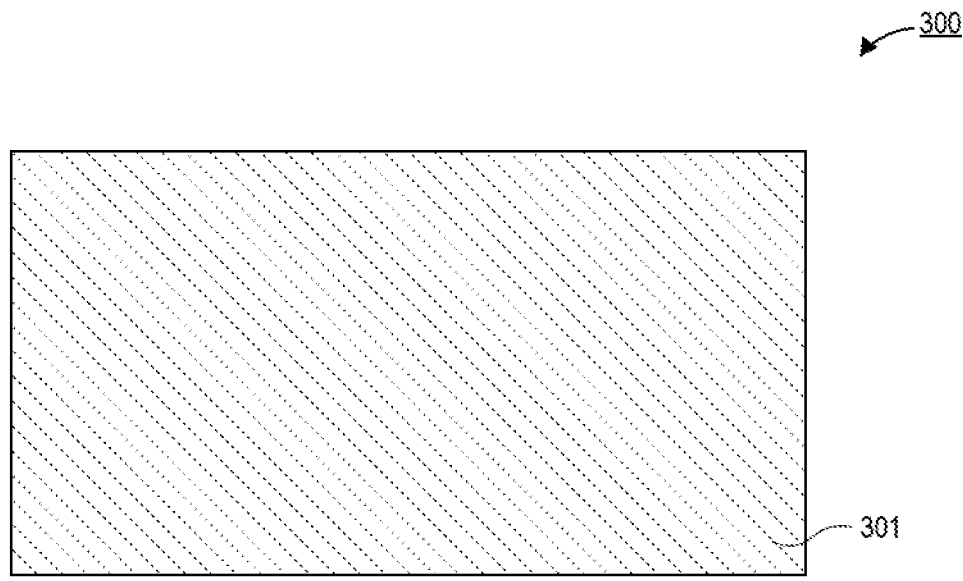
FIGS. 3A-3D are cross-sectional illustrations depicting a process for forming a first region comprising an alternating stack of channel layers and sacrificial layers and a second region comprising a single channel layer, in accordance with an embodiment.

Referring now to FIG. 3A, a cross-sectional illustration of an electronic device 300 is shown, in accordance with an embodiment. In an embodiment, the electronic device 300 comprises a substrate 301. The substrate 300 may be a material substantially similar to the substrate 101 in FIG. 1A.

Figure 3B:
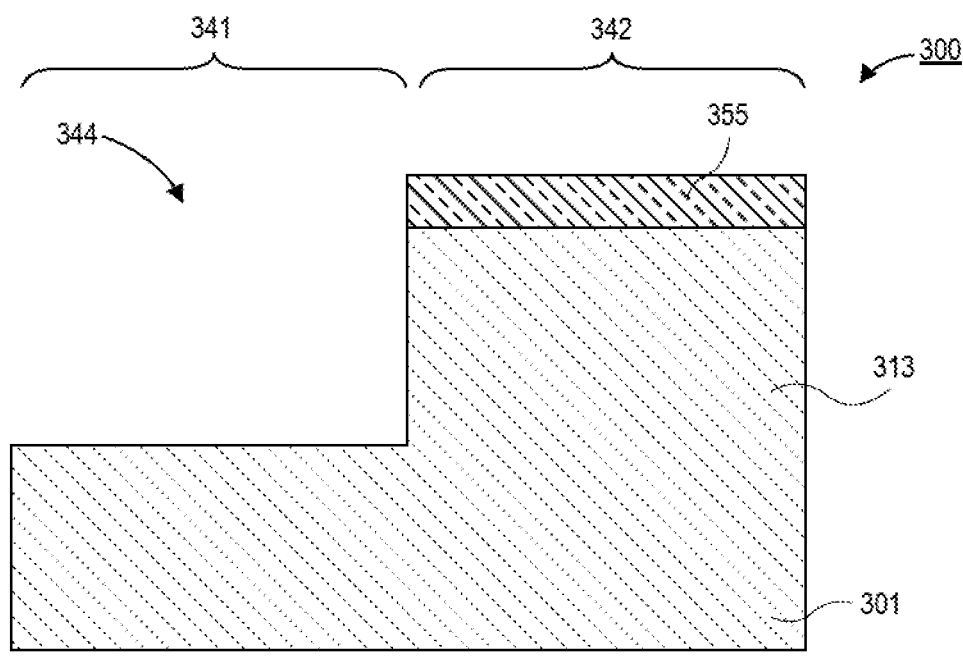

Referring now to FIG. 3B, a cross-sectional illustration of the electronic device 300 is shown after a mask layer 355 is disposed over the substrate 300 and the substrate is patterned is shown, in accordance with an embodiment. In an embodiment, the mask layer 355 defines a first region 341 (uncovered region of the substrate 301) and a second region 342 (covered region of the substrate 301). The mask layer 355 is used to pattern the substrate 301 to form an opening 344. The opening 344 results in a channel layer 313 being left behind below the mask layer 355.

Figure 3C:
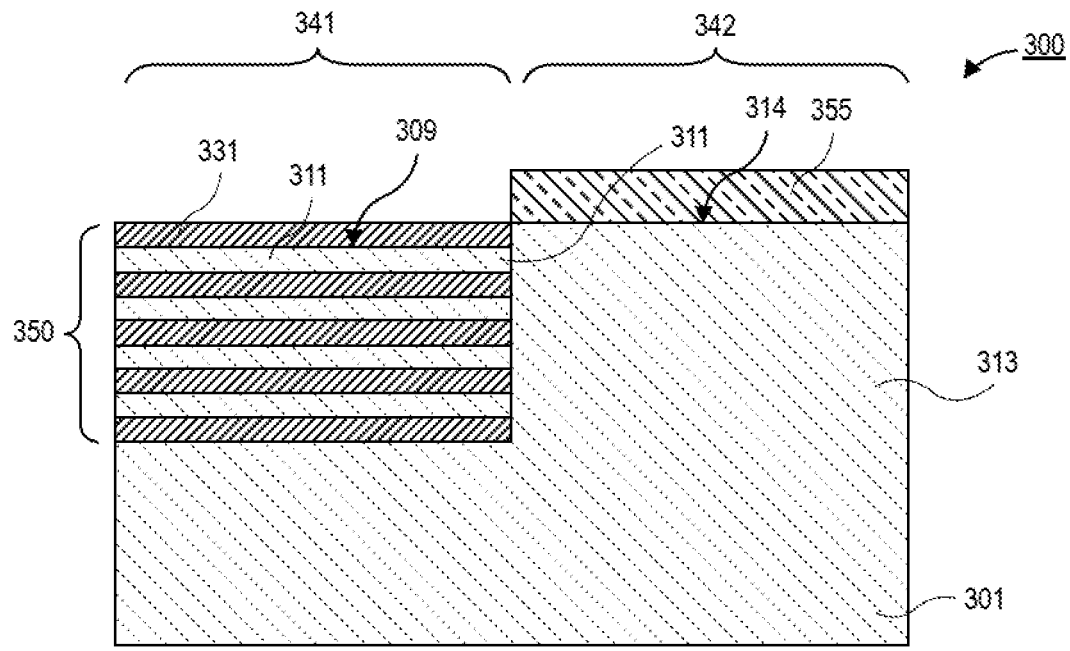

Referring now to FIG. 3C, a cross-sectional illustration of the semiconductor device 300 after a stack 350 is disposed in the opening 344 is shown, in accordance with an embodiment. In an embodiment, the stack 350 may comprise alternating channel layers 311 and sacrificial layers 331. In an embodiment, the channel layers 311 and the sacrificial layers 331 may be similar to those described above with respect to FIG. 2B. In an embodiment, a top surface 309 of the topmost channel layer 311 may be below a top surface 314 of the channel layer 313.

Figure 3D:
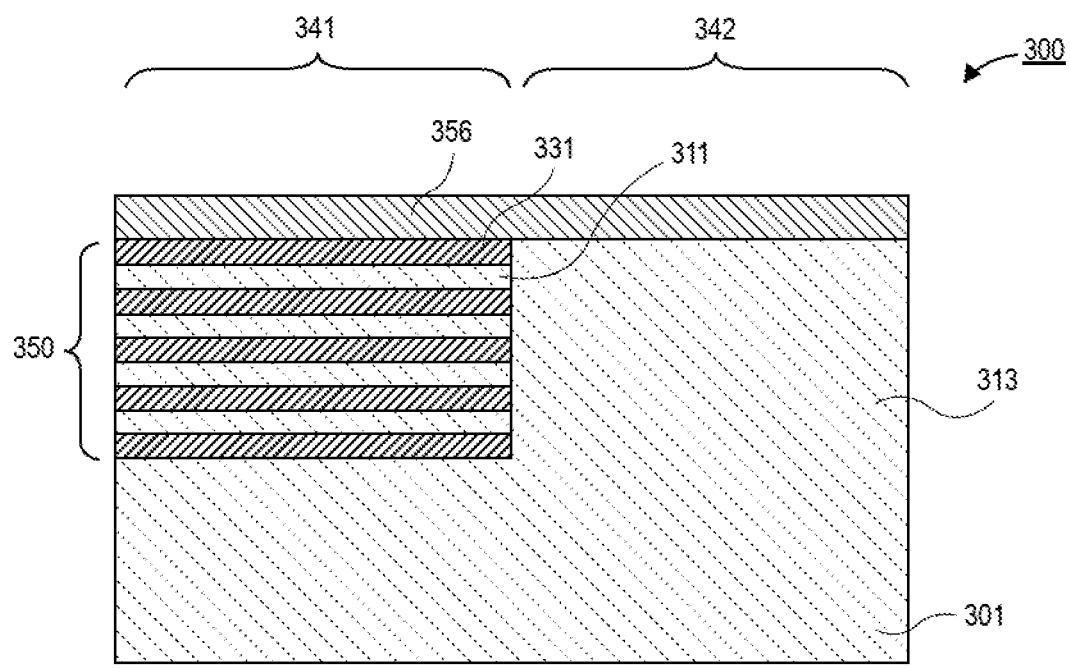

Referring now to FIG. 3D, a cross-sectional illustration of the semiconductor device 300 after a capping layer 356 is disposed over the stack 350 and the channel layer 313 is shown, in accordance with an embodiment. The capping layer 356 may be disposed after removal of the mask layer 355. In an embodiment, the capping layer 356 is an oxide or the like. The capping layer 356 may be used to protect the underlying layers during a fin patterning process.

Figure 4A:
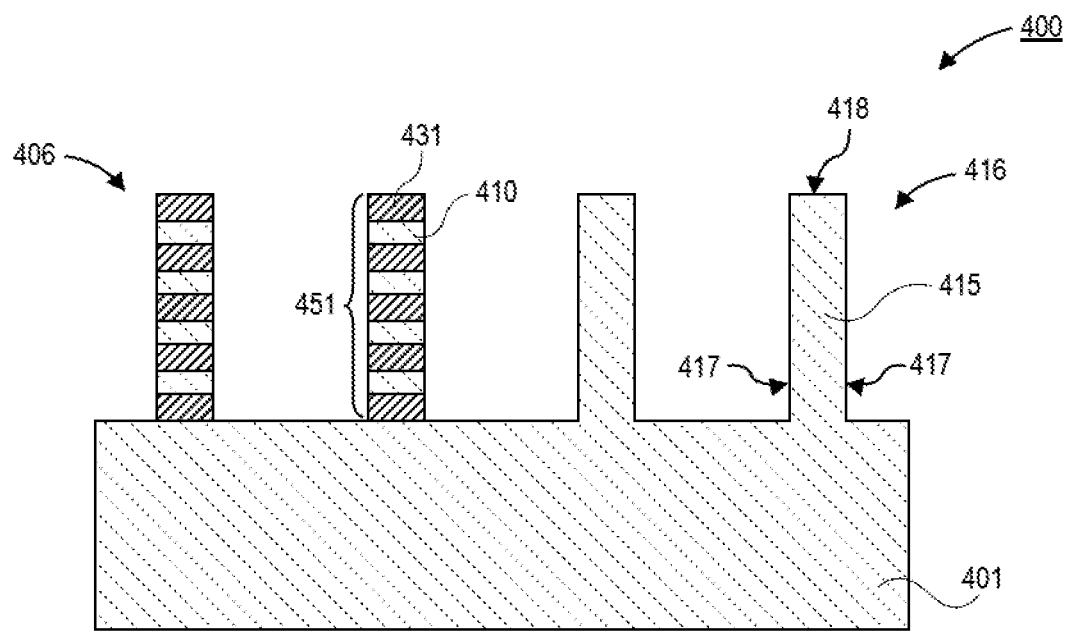
FIG. 4A is a cross-sectional illustration after the first region and the second region are patterned to form first fins and second fins, in accordance with an embodiment.

Referring now to FIG. 4A, a cross-sectional illustration of an electronic device 400 after first fins 406 and second fins 416 are patterned is shown, in accordance with an embodiment. In an embodiment, the first fins 406 are formed from a first region with a stack of alternating channel layers (e.g., channel layers 211 or 311) and sacrificial layers (e.g., sacrificial layers 231 or 331). The patterning to convert the first region into fins 406 results in the channel layers (e.g., channel layers 211 or 311) being converted to nanoribbon channels 410. That is, the fins 406 may comprise a stack 451 that is fin-shaped with alternating layers of nanoribbon channels 410 and sacrificial layers 431. The second fins 416 are formed from a second region with a single channel layer (e.g., channel layer 213 or channel layer 313). The patterning to convert the second region into fins 416 results in the single channel layer (e.g., channel layer 213 or channel layer 313) being converted into a fin channel 415.

In FIG. 4A, the profile of the fins 416 is an idealized representation of the fin formation. For example, in FIG. 4A, the fins 416 have substantially vertical sidewalls 417 and a top surface 418 that is parallel to a surface of the underlying substrate 401. However, it is to be appreciated that the profile of first fins 406 and second fins 416 may have different variations due to fabrication limitations or other design choice.

Figure 4B:
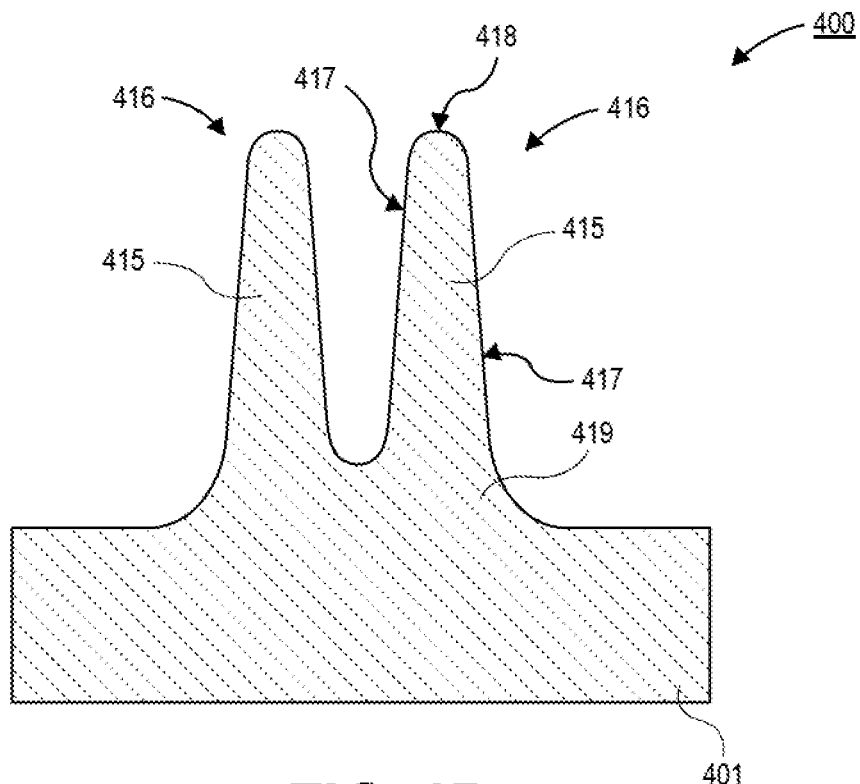
FIG. 4B is a cross-sectional illustration that depicts a profile of the first fins and the second fins, in accordance with an embodiment.

Referring now to FIG. 4B, a cross-sectional illustration of a pair of second fins 416 is shown, in accordance with an additional embodiment. As shown, the sidewall surfaces 417 may have some degree of taper. That is, in some embodiments, the sidewall surfaces 417 may not be perfectly perpendicular to the substrate 401. In an embodiment, the bottom of the fins 416 proximate to the substrate 401 may have a footing 419 or other similar structural feature typical of high aspect ratio features formed with dry etching processes. Additionally, the profile of all fins may not be uniform. For example, a nested fin may have a different profile than an isolated fin or a fin that is the outermost fin of a grouping of fins. For example, the fins 416 in FIG. 4B may be considered outermost fins, and exhibit a non-symmetric profile. As shown, the sidewall surfaces 417 that face towards a neighboring fin 416 may be shorter than the sidewall surfaces 417 that face outwards due to etching limitations. In an embodiment, the top surface 418 of the fins 416 may also be rounded, or otherwise non-planar. FIG. 4B illustrates examples of second fins 416, but it is to be appreciated that substantially similar profiles may be exhibited in the first fins 406 as well.

Referring now to FIGS. 5A-5G, a series of cross-sectional illustrations depicting a process for forming first nanoribbon transistors and second tri-gate transistors with a single processing flow is shown, in accordance with an embodiment. In each of FIGS. 5A-5G, a cross-sectional illustration is provided along the length of the first transistor channel and the second transistor channel. Each of FIGS. 5A-5G also provide a pair of cross-sections across the channel for each of the first transistor and the second transistor.

Figure 5A:
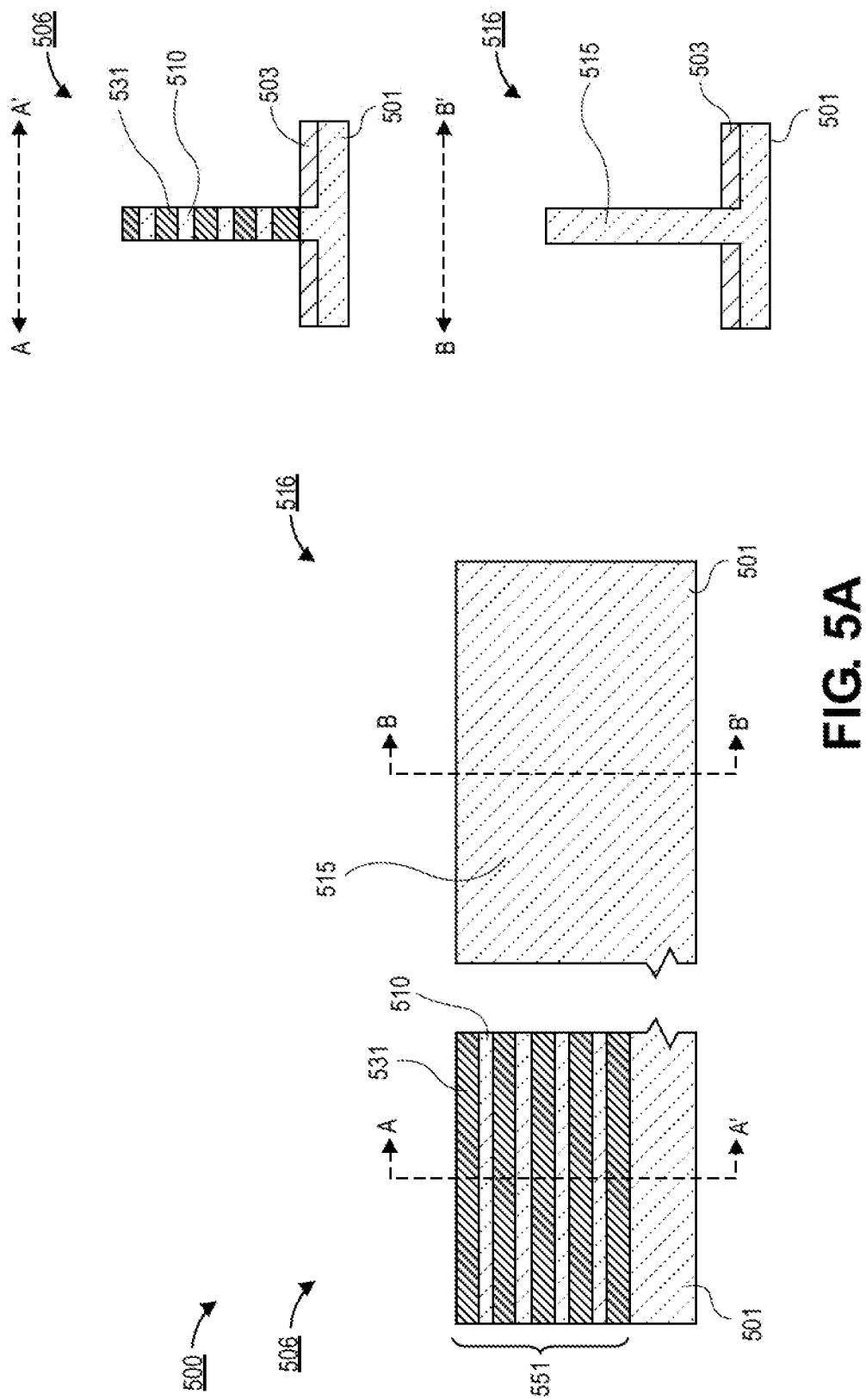
FIGS. 5A-5G are cross-sectional illustrations depicting a process for forming a first transistor and a second transistor from the first fins and the second fins, in accordance with an embodiment.

Referring now to FIG. 5A, a set of cross-sectional illustrations of an electronic device 500 after a first fin 506 and a second fin 516 are patterned is shown, in accordance with an embodiment. In an embodiment, the first fin 506 and the second fin 516 may be patterned from a process that includes the process flow of FIGS. 2A-2F or FIGS. 3A-3D. The first fins 506 comprise a stack 551 over a substrate 501. The stack 551 comprises alternating nanoribbon channels 510 and sacrificial layers 531. The second fins 516 may comprise a fin channel 515. The fin channel 515 may extend up from the substrate 501. An isolation layer 503 may be disposed over a surface of the substrate 501 on the sides of the first fin 506 and the second fin 516.

Figure 5B:
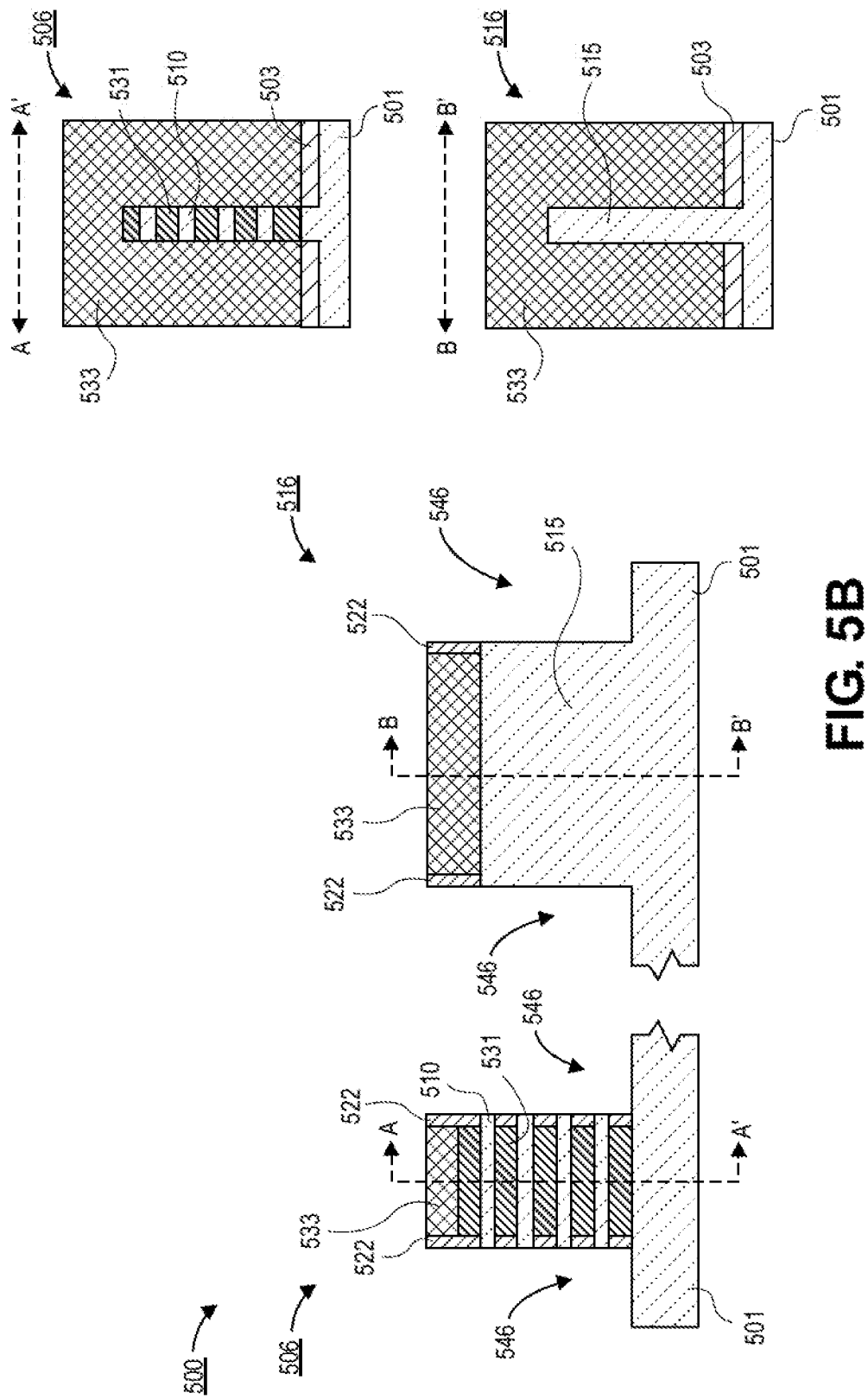

Referring now to FIG. 5B, a set of cross-sectional illustrations of the electronic device 500 after a sacrificial gate 533 and spacers 522 are formed is shown, in accordance with an embodiment. FIG. 5B also illustrates the recessing of portions of the first fin 506 and the second fin 516 to provide source/drain openings 546. The sacrificial gate 533 covers the top of the fins 506 and 516 and wraps down along the sidewalls of the fins 506 and 516. The spacers 522 may be disposed on opposite ends of the sacrificial gate 533. The nanoribbon channels 510 and the fin channel 515 extend through the spacers 522.

Figure 5C:
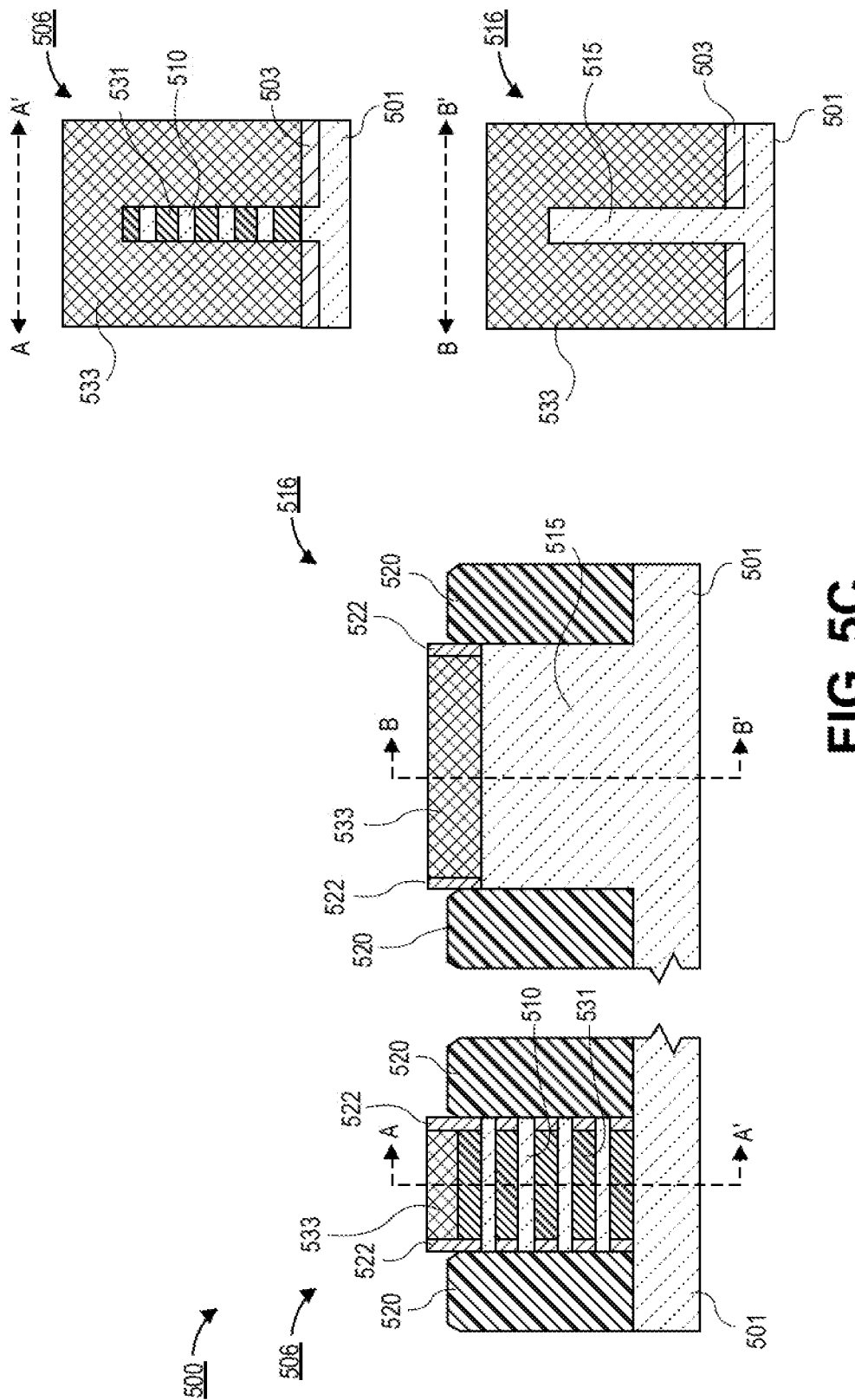

Referring now to FIG. 5C, a set of cross-sectional illustrations of the electronic device 500 after source/drain regions 520 are formed is shown, in accordance with an embodiment. In an embodiment, the source/drain regions 520 may be grown with an epitaxial growth process. The source/drain regions 520 may be in-situ doped during growth to provide N-type or P-type source/drain regions 520. Suitable materials and dopants for source/drain regions 520 are described in greater detail above.

Figure 5D:
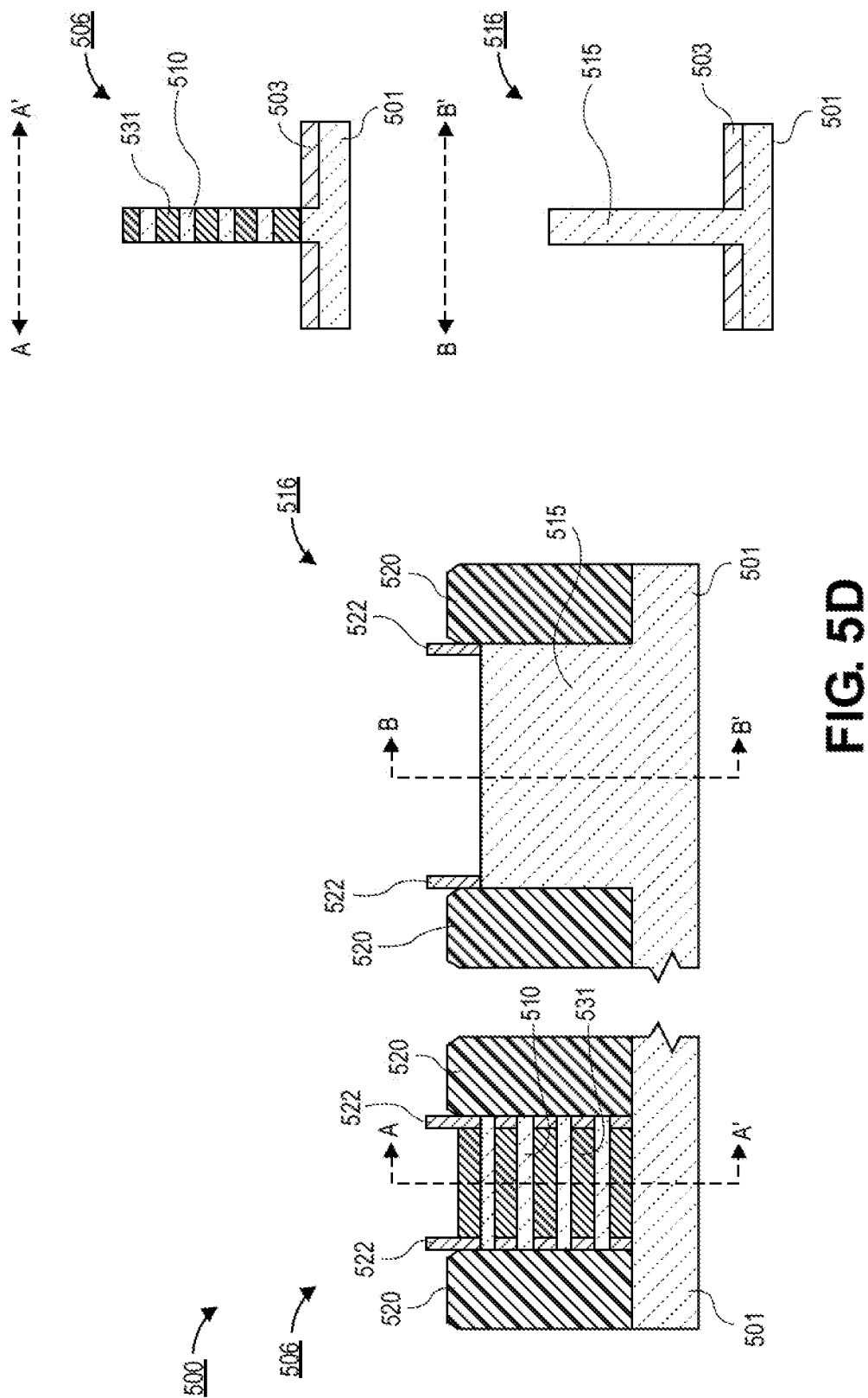

Referring now to FIG. 5D, a set of cross-sectional illustrations of the electronic device 500 after the sacrificial gate 533 is removed is shown, in accordance with an embodiment. The sacrificial gate 533 may be removed with a suitable etching process. Removal of the sacrificial gate 533 exposes the nanoribbon channels 510 and the fin channel 515.

Figure 5E:
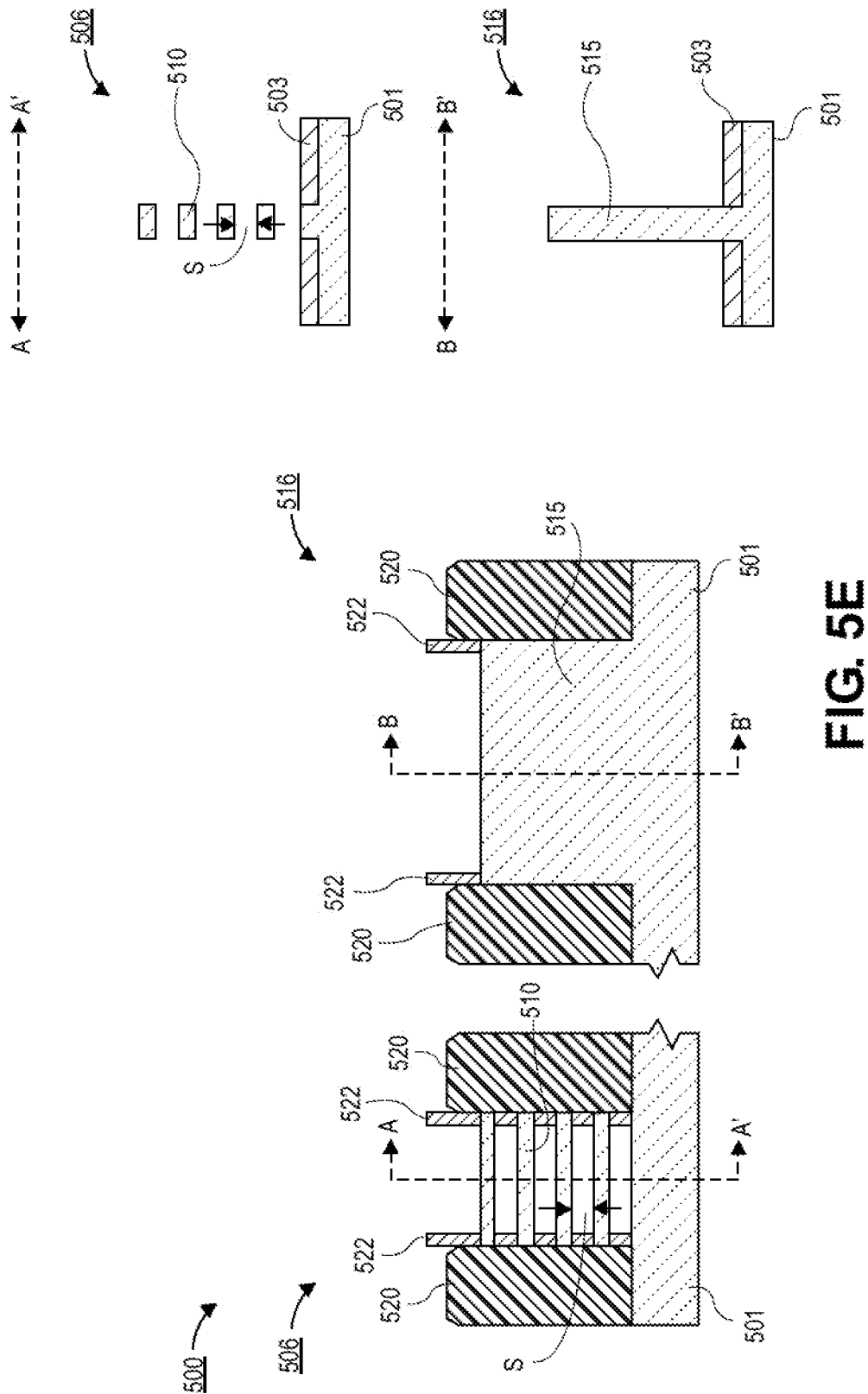

Referring now to FIG. 5E, a set of cross-sectional illustrations of the electronic device 500 after the sacrificial layers 531 are selectively removed to release the nanoribbon channels 510 is shown, in accordance with an embodiment. Removal of the sacrificial layers 531 clears a spacing S between each of the nanoribbon channels 510. In an embodiment, the spacing S may be approximately 10 nm or less.

Sacrificial layers 531 may be removed using any known etchant that is selective to nanoribbon channels 510. In an embodiment, the selectivity is greater than 100:1. In an embodiment where nanoribbons channels 510 are silicon and sacrificial layers 531 are silicon germanium, sacrificial layers 531 are selectively removed using a wet etchant such as, but not limited to, aqueous carboxylic acid/nitric acid/HF solution and aqueous citric acid/nitric acid/HF solution. In an embodiment where nanoribbon channels 510 are germanium and sacrificial layers 531 are silicon germanium, sacrificial layers 531 are selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. In another embodiment, sacrificial layers 531 are removed by a combination of wet and dry etch processes.

Figure 5F:
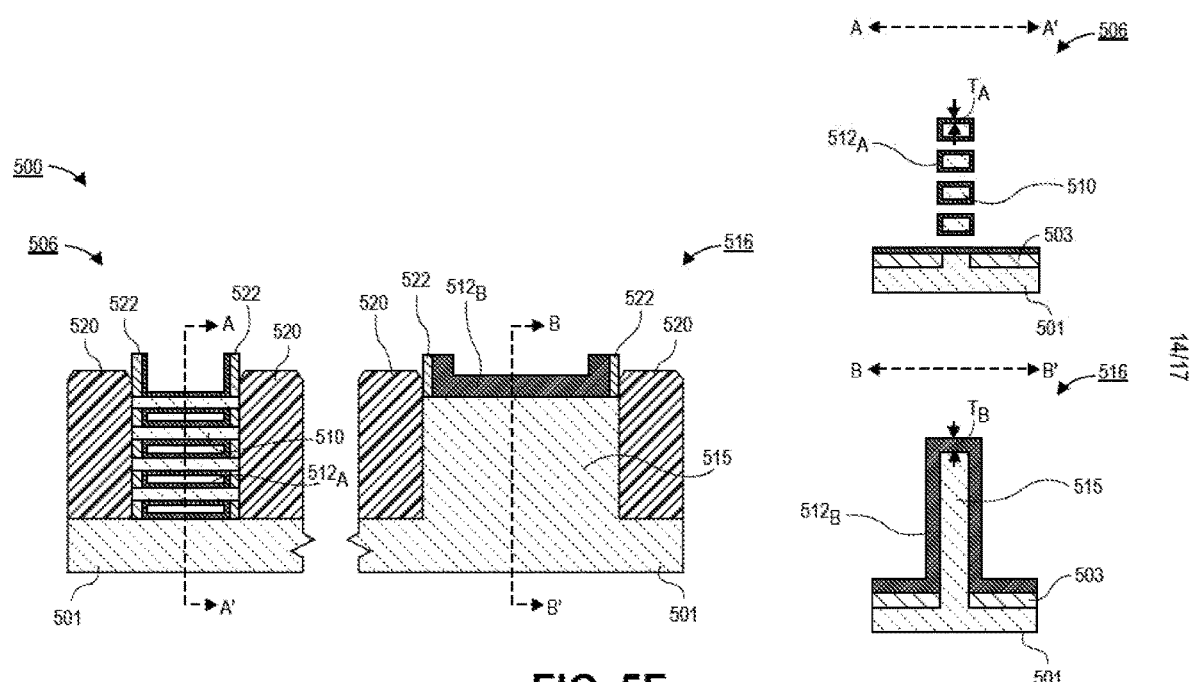

Referring now to FIG. 5F, a set of cross-sectional illustrations of the electronic device 500 after gate dielectrics 512 are disposed over the nanoribbon channels 510 and the fin channel 515 is shown, in accordance with an embodiment. In an embodiment, a first gate dielectric $512_A$ is disposed over the nanoribbon channels 510. Particularly, the cross-section A-A' illustrates that the nanoribbon channels 510 are completely surrounded by the first gate dielectric $512_A$ to enable GAA control of the nanoribbon channels 510. The first gate dielectric $512_A$ has a first thickness $T_A$. In an embodiment, the first thickness $T_A$ may be approximately 3 nm or less. In an embodiment, the first gate dielectric $512_A$ may be deposited with an ALD process or grown with an oxidation process. In embodiments where the first gate dielectric $512_A$ is deposited with an ALD process, the first gate dielectric $512_A$ may also be disposed over interior sidewalls of the spacers 522 and over portions of the isolation layer 503, as shown in FIG. 5F.

In an embodiment, a second gate dielectric $512_B$ is disposed over the fin channel 515. Particularly, the cross-section B-B' illustrates that the fin channel 515 is surrounded on sidewall surfaces and a top surface to enable tri-gate control of the fin channel 515. The second gate dielectric $512_B$ has a second thickness $T_B$. In an embodiment, the second thickness $T_B$ is greater than the first thickness $T_A$. For example, the second thickness $T_B$ may be approximately 3 nm or greater. In an embodiment, the second gate dielectric $512_B$ may be deposited with an ALD process or grown with an oxidation process. In embodiments where the second gate dielectric $512_B$ is deposited with an ALD process, the second gate dielectric $512_B$ may also be disposed over interior sidewalls of the spacers 522 and over portions of the isolation layer 503, as shown in FIG. 5F.

In an embodiment, the first gate dielectric $512_A$ may be the same material as the second gate dielectric $512_B$. In other embodiments, the first gate dielectric $512_A$ may be a different material than the second gate dielectric $512_B$. In some embodiments, the first gate dielectric $512_A$ may be deposited (or grown) with a first process, and the second gate dielectric $512_B$ may be deposited (or grown) with a second process that is different from the first process. In other embodiments, the first gate dielectric $512_A$ may be deposited (or grown) in parallel with the second gate dielectric $512_B$. In such embodiments, once the desired first thickness $T_A$ of the first gate dielectric $512_A$ is reached, the first gate dielectric $512_A$ may be masked off, and the process may continue to increase the thickness of the second gate dielectric $512_B$ to the desired second thickness $T_B$.

Figure 5G:
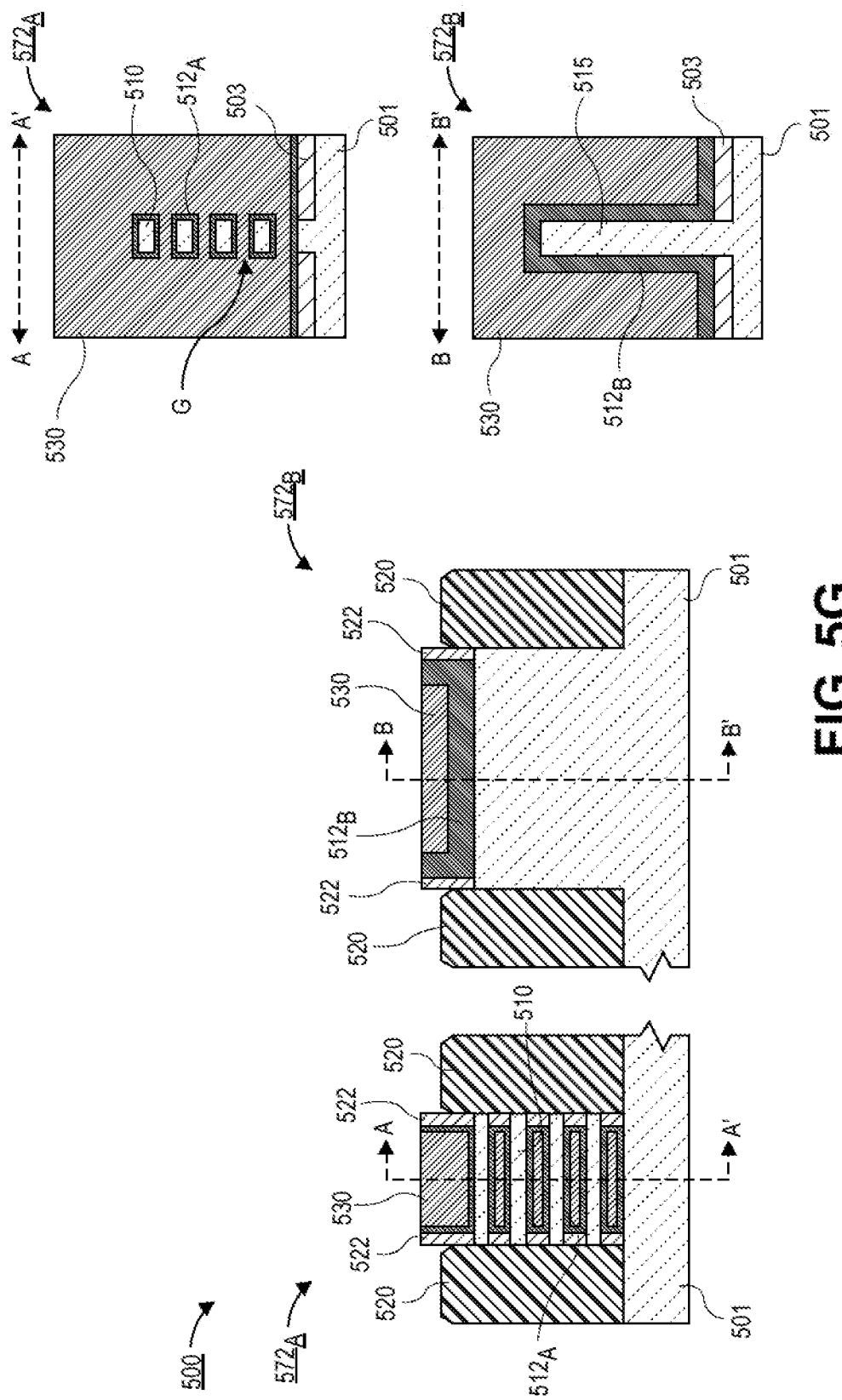

Referring now to FIG. 5G, a set of cross-sectional illustrations of the electronic device 500 after gate electrodes 530 are disposed over the gate dielectrics $512_A$ and $512_B$ is shown, in accordance with an embodiment. In an embodiment, the gate electrodes 500 may be disposed with a suitable deposition process (e.g., ALD, chemical vapor deposition (CVD), etc.). The gate electrodes 530 may comprise work function metals suitable for operation of the transistors $572_A$ and $572_B$ as P-type or N-type transistors. As shown in cross-section A-A', the gate electrode 530 fills the gap G between nanoribbon channels 510 as well as the sidewalls of the nanoribbon channels 510. Accordingly, GAA control of the nanoribbon channels 510 is provided. As show in cross-section B-B', the gate electrode 530 wraps around a pair of sidewalls and the top surface of the fin channel 515 in order to provide tri-gate control of the fin channel 515.

Figure 6:
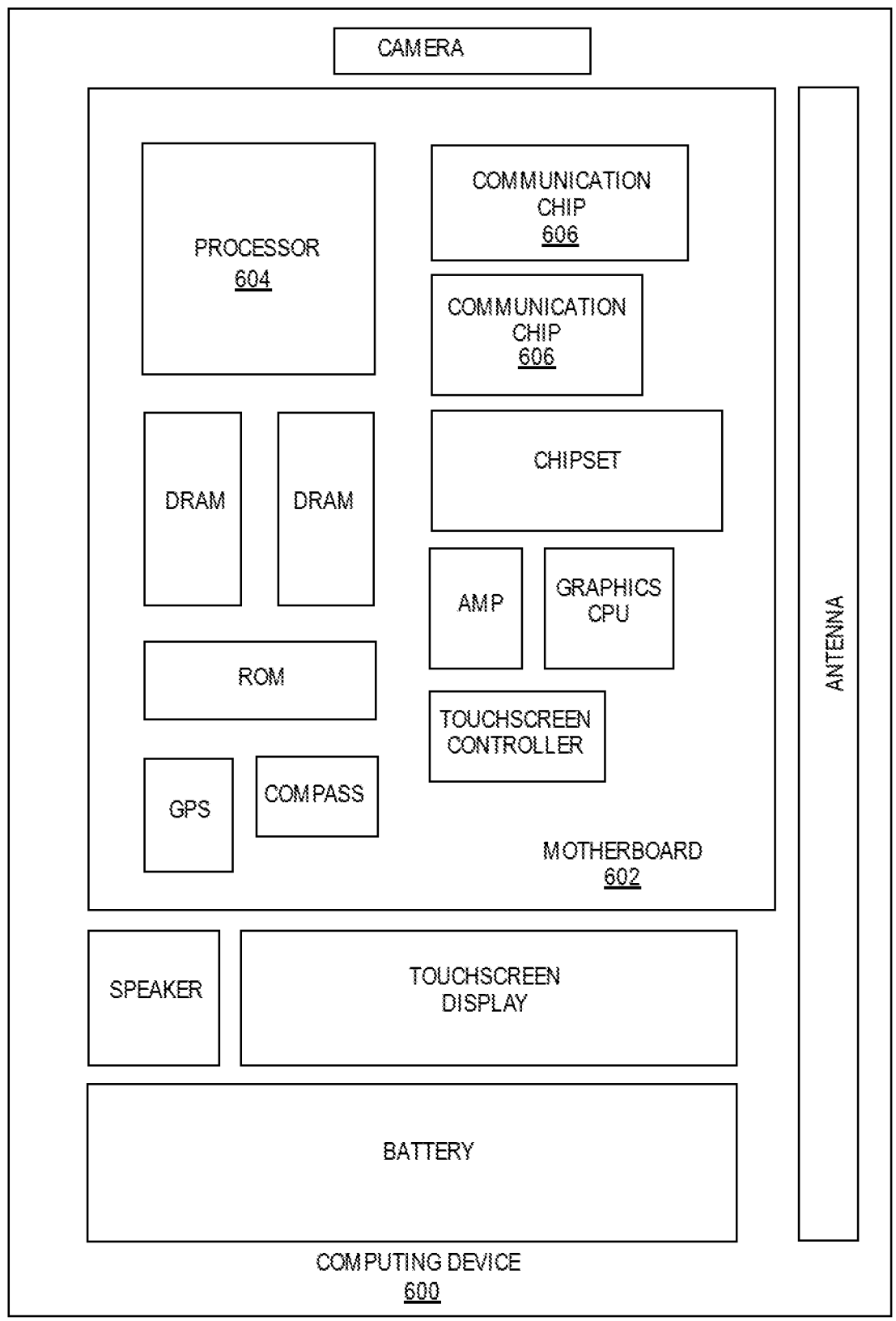
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor 604 may comprise a nanoribbon transistor with a first gate dielectric thickness and a tri-gate transistor with a second gate dielectric thickness that is greater than the first gate dielectric thickness, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip 606 may comprise a nanoribbon transistor with a first gate dielectric thickness and a tri-gate transistor with a second gate dielectric thickness that is greater than the first gate dielectric thickness, as described herein.

In further implementations, another component housed within the computing device 600 may comprise a nanoribbon transistor with a first gate dielectric thickness and a tri-gate transistor with a second gate dielectric thickness that is greater than the first gate dielectric thickness, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
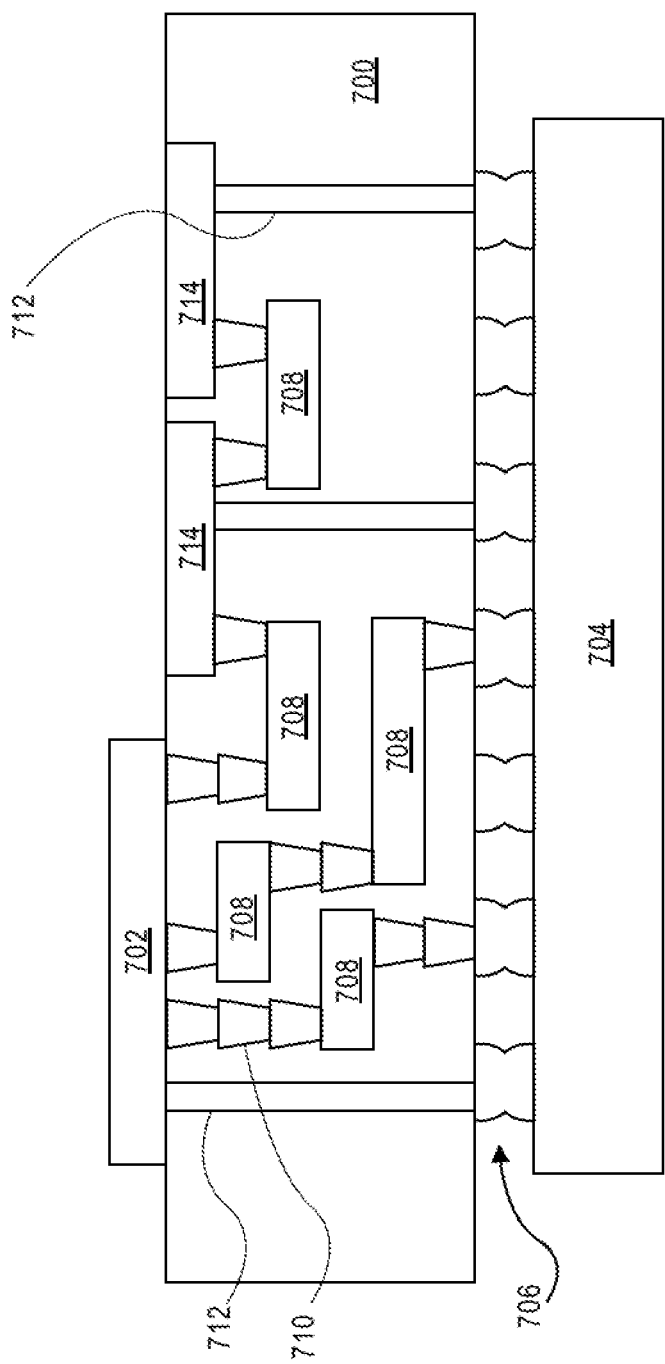
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise a nanoribbon transistor with a first gate dielectric thickness and a tri-gate transistor with a second gate dielectric thickness that is greater than the first gate dielectric thickness, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise semiconductor devices that comprise a nanoribbon transistor with a first gate dielectric thickness and a tri-gate transistor with a second gate dielectric thickness that is greater than the first gate dielectric thickness, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a first transistor over the substrate, wherein the first transistor comprises: a vertical stack of first semiconductor channels; and a first gate dielectric surrounding each of the first semiconductor channels, wherein the first gate dielectric has a first thickness; and a second transistor over the substrate, wherein the second transistor comprises: a second semiconductor channel, wherein the second semiconductor channel comprises pair of sidewalls and a top surface; and a second gate dielectric over the pair of sidewalls and the top surface of the fin, wherein the second gate dielectric has a second thickness that is greater than the first thickness.

Example 2: the semiconductor device of Example 1, wherein the first semiconductor channels are nanoribbons or nanowires.

Example 3: the semiconductor device of Example 1 or Example 2, wherein the second semiconductor channel is part of a fin that extends up from the substrate.

Example 4: the semiconductor device of Examples 1-3, wherein the first thickness is approximately 3 nm or less, and wherein the second thickness is approximately 3 nm or greater.

Example 5: the semiconductor device of Examples 1-4, wherein a spacing between the first semiconductor channels is approximately 10 nm or less.

Example 6: the semiconductor device of Examples 1-5, wherein the first transistor has a first channel length, and wherein the second transistor has a second channel length that is greater than the first channel length.

Example 7: the semiconductor device of Example 6, wherein the second channel length is approximately 50 nm or greater.

Example 8: the semiconductor device of Examples 1-7, wherein the first transistor is a logic transistor, and wherein the second transistor is a high-voltage transistor.

Example 9: the semiconductor device of Examples 1-8, wherein the top surface of the second semiconductor channel is above a top surface of a topmost first semiconductor channel in the vertical stack of first semiconductor channels.

Example 10: a method of forming a semiconductor device, comprising: forming a first region and a second region on a substrate, wherein the first region comprises an alternating stack of first channel layers and sacrificial layers, and wherein the second region comprises a single second channel layer; patterning the first region and the second region to form a first fin in the first region and a second fin in the second region; forming a first transistor from the first fin, wherein the forming comprises removing the sacrificial layers from the first fin and disposing a first gate dielectric around each of the first channel layers, wherein the first gate dielectric has a first thickness; and forming a second transistor from the second fin, wherein the forming comprises disposing a second gate dielectric over sidewall surfaces and a top surface of the second fin, wherein the second gate dielectric has a second thickness that is greater than the first thickness.

Example 11: the method of claim 10, wherein forming the first region and the second region, comprises: forming the alternating stack of first channel layers and sacrificial layers; masking a portion of the alternating stack, wherein a masked portion of the alternating stack defines the first region and wherein an unmasked portion of the alternating stack defines the second region; removing the unmasked portion of the alternating stack to expose the substrate; and growing the second channel layer up from the substrate.

Example 12: the method of Example 10, wherein forming the first region and the second region comprises: masking the substrate, wherein a masked portion of the substrate defines the second channel layer in the second region, and wherein an unmasked portion of the substrate defines the first region; etching the substrate in the first region; and growing an alternating stack of first channel layers and sacrificial layers in the first region.

Example 13: the method of Examples 10-12, wherein a topmost layer and a bottommost layer of the alternating stack are sacrificial layers.

Example 14: the method of Examples 10-13, wherein the first channel layers in the first fin are nanoribbons or nanowires.

Example 15: the method of Examples 10-14, wherein the first thickness is approximately 3 nm or less, and wherein the second thickness is approximately 3 nm or greater.

Example 16: the method of Examples 10-15, wherein a spacing between the first channel layers is approximately 10 nm or less.

Example 17: a semiconductor device, comprising: a substrate; a gate all around (GAA) transistor over the substrate, wherein the GAA transistor comprises a first gate dielectric with a first thickness; and a tri-gate transistor over the substrate, wherein the tri-gate transistor comprises a second gate dielectric with a second thickness that is greater than the first thickness.

Example 18: the semiconductor device of Example 17, wherein the GAA transistor is a nanowire transistor or a nanoribbon transistor.

Example 19: the semiconductor device of Example 17 or Example 18, wherein the first thickness is approximately 3 nm or less, and wherein the second thickness is approximately 3 nm or greater.

Example 20: the semiconductor device of Examples 17-19, wherein the GAA transistor has a first channel length, and wherein the tri-gate transistor has a second channel length that is greater than the first channel length.

Example 21: the semiconductor device of Examples 17-20, wherein the GAA transistor is a logic transistor, and wherein the tri-gate transistor is a high-voltage transistor.

Example 22: the semiconductor device of Example 21, wherein an operating voltage of the high-voltage transistor is approximately 1.0V or greater.

Example 23: an electronic device, comprising: a board; a semiconductor package electrically coupled to the board; and a die electrically coupled to the semiconductor package, wherein the die comprises: a substrate; a gate all around (GAA) transistor over the substrate, wherein the GAA transistor comprises a first gate dielectric with a first thickness; and a tri-gate transistor over the substrate, wherein the tri-gate transistor comprises a second gate dielectric with a second thickness that is greater than the first thickness.

Example 24: the electronic device of Example 23, wherein the GAA transistor is a logic transistor, and wherein the tri-gate transistor is a high-voltage transistor.

Example 25: the electronic device of Example 23 or Example 24, wherein the first thickness is approximately 3 nm or less, and wherein the second thickness is approximately 3 nm or greater.

What is claimed is:

1. A semiconductor device, comprising:
   a substrate;
   a first transistor over the substrate, wherein the first transistor comprises:
      a vertical stack of first semiconductor channels, wherein each of the first semiconductor channels has a width along a horizontal direction;
      a first gate dielectric surrounding each of the first semiconductor channels, wherein the first gate dielectric has a first thickness; and
      a first gate electrode having a first gate length along a source to drain direction; and
   a second transistor over the substrate, wherein the second transistor comprises:
      a second semiconductor channel, wherein the second semiconductor channel is a fin that comprises pair of sidewalls and a top surface, wherein the fin comprises a semiconductor material continuous from a bottom of the fin to the top surface of the fin, and wherein the fin has a width along the horizontal direction, the width of the fin greater than the width of each of the first semiconductor channels along the horizontal direction;
      a second gate dielectric over the pair of sidewalls and the top surface of the fin, wherein the second gate dielectric has a second thickness that is greater than the first thickness; and
      a second gate electrode having a second gate length along the source to drain direction, the second gate length different than the first gate length, and the second gate electrode separate and distinct from the first gate electrode.

2. The semiconductor device of claim 1, wherein the first semiconductor channels are nanoribbons or nanowires.

3. The semiconductor device of claim 1, wherein the fin extends up from the substrate.

4. The semiconductor device of claim 1, wherein the first thickness is approximately 3 nm or less, and wherein the second thickness is approximately 3 nm or greater.

5. The semiconductor device of claim 1, wherein a spacing between the first semiconductor channels is approximately 10 nm or less.

6. The semiconductor device of claim 1, wherein the first transistor has a first channel length, and wherein the second transistor has a second channel length that is greater than the first channel length.

7. The semiconductor device of claim 6, wherein the second channel length is approximately 50 nm or greater.

8. The semiconductor device of claim 1, wherein the first transistor is a logic transistor, and wherein the second transistor is a high-voltage transistor.

9. The semiconductor device of claim 1, wherein the top surface of the second semiconductor channel is above a top surface of a topmost first semiconductor channel in the vertical stack of first semiconductor channels.

10. A semiconductor device, comprising:
    a substrate;
    a gate all around (GAA) transistor over the substrate, wherein the GAA transistor comprises a first gate dielectric with a first thickness and a first gate electrode having a first gate length along a source to drain direction, wherein the GAA transistor has a semiconductor channel having a width along a horizontal direction; and
    a tri-gate transistor over the substrate, the tri-gate transistor including a fin comprising a semiconductor material continuous from a bottom of the fin to a top surface of the fin, wherein the tri-gate transistor comprises a second gate dielectric with a second thickness that is greater than the first thickness, and a second gate electrode having a second gate length along the source to drain direction, the second gate length different than the first gate length, and the second gate electrode separate and distinct from the first gate electrode, and wherein the fin has a width along the horizontal direction, the width of the fin greater than the width of the semiconductor channel of the GAA transistor along the horizontal direction.

11. The semiconductor device of claim 10, wherein the GAA transistor is a nanowire transistor or a nanoribbon transistor.

12. The semiconductor device of claim 10, wherein the first thickness is approximately 3 nm or less, and wherein the second thickness is approximately 3 nm or greater.

13. The semiconductor device of claim 10, wherein the GAA transistor has a first channel length, and wherein the tri-gate transistor has a second channel length that is greater than the first channel length.

14. The semiconductor device of claim 10, wherein the GAA transistor is a logic transistor, and wherein the tri-gate transistor is a high-voltage transistor.

15. The semiconductor device of claim 14, wherein an operating voltage of the high-voltage transistor is approximately 1.0V or greater.

16. An electronic device, comprising:
    a board;
    a semiconductor package electrically coupled to the board; and
    a die electrically coupled to the semiconductor package, wherein the die comprises:
       a substrate;
       a gate all around (GAA) transistor over the substrate, wherein the GAA transistor comprises a first gate dielectric with a first thickness and a first gate electrode having a first gate length along a source to drain direction, wherein the GAA transistor has a semiconductor channel having a width along a horizontal direction; and
       a tri-gate transistor over the substrate, the tri-gate transistor including a fin comprising a semiconductor material continuous from a bottom of the fin to a top surface of the fin, wherein the tri-gate transistor comprises a second gate dielectric with a second thickness that is greater than the first thickness, and a second gate electrode having a second gate length along the source to drain direction, the second gate length different than the first gate length, and the second gate electrode separate and distinct from the first gate electrode, and wherein the fin has a width along the horizontal direction, the width of the fin greater than the width of the semiconductor channel of the GAA transistor along the horizontal direction.

17. The electronic device of claim 16, wherein the GAA transistor is a logic transistor, and wherein the tri-gate transistor is a high-voltage transistor.

18. The electronic device of claim 16, wherein the first thickness is approximately 3 nm or less, and wherein the second thickness is approximately 3 nm or greater.

* * * * *